United States Patent
Herard et al.

(10) Patent No.: US 11,942,496 B2
(45) Date of Patent: Mar. 26, 2024

(54) SLANTED GLASS EDGE FOR IMAGE SENSOR PACKAGE

(71) Applicant: STMicroelectronics Pte Ltd, Singapore (SG)

(72) Inventors: Laurent Herard, Singapore (SG); David Gani, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 243 days.

(21) Appl. No.: 17/326,537

(22) Filed: May 21, 2021

(65) Prior Publication Data
US 2021/0384241 A1  Dec. 9, 2021

Related U.S. Application Data

(60) Provisional application No. 63/034,464, filed on Jun. 4, 2020.

(51) Int. Cl.
*H01L 27/146* (2006.01)

(52) U.S. Cl.
CPC .............................. *H01L 27/14618* (2013.01)

(58) Field of Classification Search
CPC ......... H01L 27/14618; H01L 27/14632; H01L 27/14634
See application file for complete search history.

(56) References Cited

U.S. PATENT DOCUMENTS

| 9,294,697 | B2 * | 3/2016 | Iwasaki | H01L 27/14623 |
| 9,503,622 | B2 | 11/2016 | Jiang et al. | |
| 9,653,504 | B1 | 5/2017 | Lin et al. | |
| 10,312,276 | B2 | 6/2019 | Chien et al. | |
| 2008/0186583 | A1 | 8/2008 | Takayama | |
| 2009/0200622 | A1 * | 8/2009 | Tai | H01L 27/14685 257/432 |
| 2010/0252902 | A1 * | 10/2010 | Tanida | H01L 27/14632 257/E31.127 |
| 2015/0015751 | A1 | 1/2015 | Iwasaki et al. | |
| 2016/0005778 | A1 * | 1/2016 | Jun | H01L 27/14618 257/434 |
| 2017/0154913 | A1 | 6/2017 | Jun | |
| 2019/0019831 | A1 * | 1/2019 | Takachi | H01L 27/14685 |
| 2019/0165024 | A1 | 5/2019 | Bradley, Jr. et al. | |

FOREIGN PATENT DOCUMENTS

| EP | 1560270 A2 | 8/2005 |
| WO | 2018028718 A1 | 2/2018 |

OTHER PUBLICATIONS

EP Search Report and Written Opinion for family-related EP Appl. No. 21177013.6, report dated Nov. 11, 2021, 8 pages.

* cited by examiner

*Primary Examiner* — Jonathan Han
(74) *Attorney, Agent, or Firm* — GARDERE WYNNE SEWELL LLP

(57) ABSTRACT

A digital image sensor package includes an image sensor substrate and a glass covering. The image sensor substrate carries photodiodes. The glass covering has a bottom surface, a top surface opposite the bottom surface, and a sidewall delimiting a perimeter edge of the glass covering. The glass covering overlies the photodiodes. A surface area of the top surface of the glass covering is greater than a surface area of the bottom surface of the glass covering such that the sidewall is anti-perpendicular to the top and bottom surfaces of the glass.

32 Claims, 2 Drawing Sheets

SLANTED GLASS EDGE FOR IMAGE SENSOR PACKAGE

RELATED APPLICATION

This application claims priority to U.S. Provisional Application For Patent No. 63/034,464, filed Jun. 4, 2020, the contents of which are incorporated by reference in their entirety to the maximum extent allowable under the law.

TECHNICAL FIELD

This disclosure relates to the field of digital image sensors and, in particular, to a design for a glass covering for an image sensor of an image sensor package that reduces the incidence of stray light on the image sensor to thereby reduce noise in the image acquired by the image sensor.

BACKGROUND

Digital image sensor packages are utilized in a wide array of electronic devices, such as laptops, smartphones, and tablets, so as to provide the capability of image capture.

A sample known digital image sensor package 10 in a glass-on-die packaging arrangement is shown in FIG. 1. An image sensor substrate 12 is disposed on a printed circuit board 11, and photodiodes 13 are formed in or on the image sensor substrate 12. A transparent adhesive layer 14 physically couples a glass covering 15 over the image sensor substrate 12. While this design is relatively simple and is in wide production, an issue arises in that some incoming light IL may arrive along a path whereby it enters the top side of the glass 15, then reflects off the sidewall of the glass 15 on a path leading it to strike the photodiodes 13. This path results in this incoming light IL not carrying usable information about the scene being captured, and instead simply causing noise in the information about the scene otherwise captured by the photodiodes 13.

Attempts at mitigating or eliminating this issue have been made. As shown in the digital image sensor package 10' of FIG. 2, photoabsorbent material 17 may be placed at the edge of the glass 15 such that the incoming light IL that would otherwise reflect off the sidewall of the glass 15 is absorbed, minimizing the resulting noise in the information about the scene captured by the photodiodes 13. While this design works, it adds additional steps to the manufacture of the image sensor package 10', may be incompatible with the physical layouts of some digital image sensor packages, and may be unreliable as the photoabsorbent material 17 may become detached.

Therefore, further development is needed.

SUMMARY

Disclosed herein is an digital image sensor package, including: an image sensor substrate carrying photodiodes; and a glass covering having a bottom surface, a top surface opposite the bottom surface, and a sidewall delimiting a perimeter edge of the glass covering, wherein the glass covering overlies the photodiodes; wherein a surface area of the top surface of the glass covering is greater than a surface area of the bottom surface of the glass covering such that the sidewall is anti-perpendicular to the top and bottom surfaces of the glass.

The sidewall and the top surface of the glass covering may form an acute angle, and the sidewall and the bottom surface of the glass covering may form an obtuse angle.

An outer surface of the sidewall may be flat.

Space between the sidewall and image sensor substrate may be devoid of photoabsorbent materials.

At least a portion of the bottom surface of the glass covering may be physically coupled to the image sensor substrate.

A printed circuit board may carry the image sensor substrate.

Mounting hardware may physically couple portions of the bottom surface of the glass covering to the printed circuit board.

The mounting hardware may include a first portion physically coupled to the printed circuit board and extending upwardly therefrom, a second portion extending inwardly from a periphery of the image sensor substrate toward the photodiodes, and an intermediate connecting portion connecting the first portion to the second portion. Portions of the bottom surface of the glass covering may be physically coupled to the second portion of the mounting hardware.

Also disclosed herein is a digital image sensor package, including: a printed circuit board; an image sensor substrate stacked on the printed circuit board; and a transparent covering associated with the image sensor substrate and having a bottom surface, a top surface opposite the bottom surface, and a sidewall delimiting a perimeter edge of the transparent covering, wherein the transparent covering overlies the image sensor substrate. The sidewall and the top surface of the transparent covering form a first angle, and the sidewall and the bottom surface of the transparent covering form a second angle different than the first angle. The first and second angles are such that light that enters the transparent covering on a trajectory that results in the light impinging upon the sidewall is reflected on a new trajectory that avoids the image sensor substrate.

The first angle may be an acute angle and the second angle may be an obtuse angle.

At least a portion of the bottom surface of the transparent covering may be physically coupled to the image sensor substrate.

Mounting hardware may physically couple portions of the bottom surface of the transparent covering to the printed circuit board.

The mounting hardware may include a first portion physically coupled to the printed circuit board and extending upwardly therefrom, a second portion extending inwardly from a periphery of the image sensor substrate, and an intermediate connecting portion connecting the first portion to the second portion. Portions of the bottom surface of the transparent covering may be physically coupled to the second portion of the mounting hardware.

An outer surface of the sidewall may be flat.

Space between the sidewall and image sensor substrate may be devoid of photoabsorbent materials.

Also disclosed herein is a digital image sensor package, including an image sensor, and a glass covering overlying the image sensor. The glass covering is trapezoidal in cross section, with a surface area of a top surface of the glass covering being greater than a surface area of a bottom surface of the glass covering, the bottom surface facing the image sensor and the top surface facing away from the image sensor.

The top surface of the glass covering being greater in surface area than the bottom surface of the glass covering may result in a portion of free space being located between the top surface and the image sensor.

At least a portion of the bottom surface of the glass covering may be physically coupled to the image sensor.

A printed circuit board may carry the image sensor, and mounting hardware may physically couple portions of the bottom surface of the glass covering to the printed circuit board. The mounting hardware may include a first portion physically coupled to the printed circuit board and extending upwardly therefrom, a second portion extending inwardly from a periphery of the image sensor, and an intermediate connecting portion connecting the first portion to the second portion. Portions of the bottom surface of the glass covering may be physically coupled to the second portion of the mounting hardware.

The trapezoidal cross section of the glass covering may include the top surface, the bottom surface, and a sidewall connecting the top surface to the bottom surface. The trapezoidal cross section of the glass covering may result in light that enters the glass covering on a trajectory which results in the light impinging upon the sidewall being reflected away from the image sensor.

A method aspect is also disclosed herein. The method is a method of reducing noise captured by an image sensor. The method may include affixing a bottom surface of a glass covering to the image sensor, permitting light to impinge upon the glass covering, and shaping the glass covering such that when the light that impinges upon the glass covering impinges upon a sidewall of the glass covering, the sidewall reflects the light on a trajectory away from the image sensor.

Shaping the glass covering may include shaping the glass covering to be trapezoidal in cross section such that when the light that impinges upon the glass covering impinges upon the sidewall of the trapezoidal cross section, the sidewall reflects the light on the trajectory away from the image sensor.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 3:
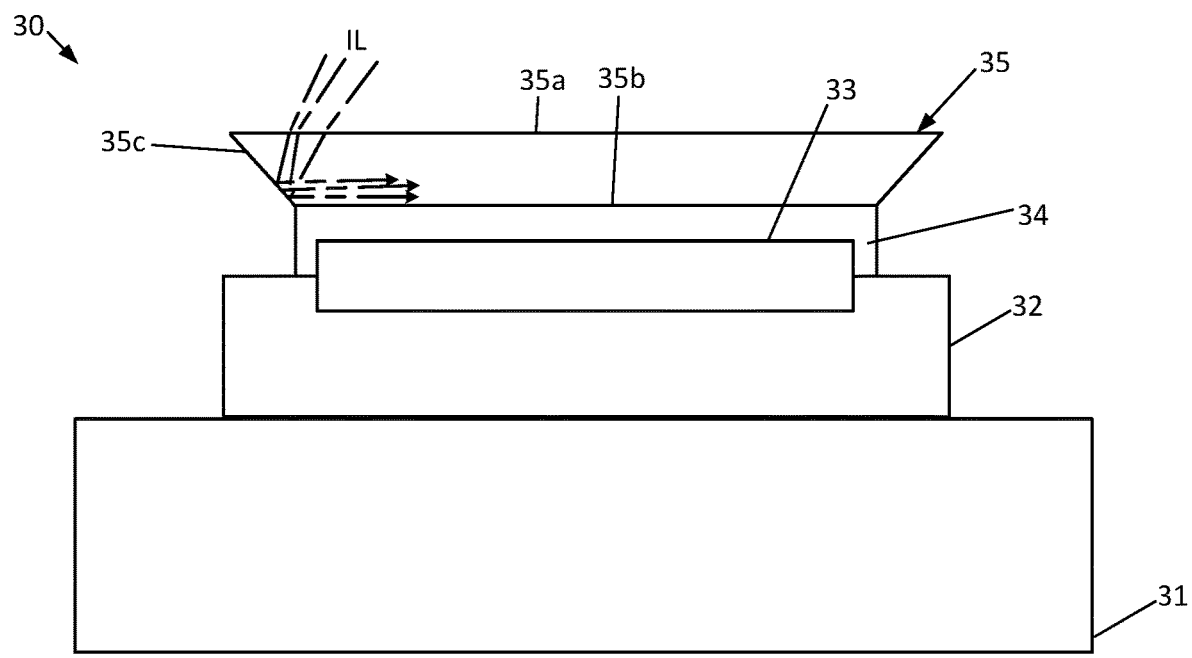
FIG. 3 is a side view of a digital image sensor package in glass-on-die format disclosed herein that addresses the drawbacks of the known digital image sensor package of FIG. 1 by appropriately shaping the glass.

A digital image sensor package 30 in a glass-on-die packaging arrangement is shown in FIG. 3. An image sensor substrate 32 is disposed on a printed circuit board (PCB) 31, and photodiodes 33 are formed in or on the image sensor substrate 32. A transparent adhesive layer 34 physically couples a covering 35 (e.g., glass, such as a glass lens) over the image sensor substrate 32.

In greater detail, the glass covering 35 has a top surface 35a, a bottom surface 35b, and a sidewall 35c delimiting a perimeter edge of the glass covering. The bottom surface 35b of the glass covering 35 is physically coupled to the image sensor substrate 32 over the photodiodes 33 by the transparent adhesive layer 34. The top surface 35a of the glass covering 35 is greater in diameter and/or surface area than the bottom surface 35b, such that the sidewall 35c is angled with respect to normal (i.e., is angled away from a direction perpendicular to the bottom surface 35b and/or the plane within which the photodiodes 33 are formed for the substrate 32 and/or the bottom of the PCB 31). In particular, the angle formed by the sidewall 35c and the bottom surface 35b is an obtuse angle (greater than 90°), and/or the angle formed by the sidewall 35c and the top surface 35a is an acute angle (less than 90°.

The purpose of the angles formed by the sidewall 35c with respect to the top surface 35a and/or bottom surface 35b of the glass covering 35 is to cause incoming light IL that reflects off the sidewall 35c to reflect along a trajectory that avoids the photodiodes 33, as illustrated. This way, despite the fact that incoming light IL is reflecting off the sidewall 35c, it does not contribute to noise in the information about the scene captured by the photodiodes 33, thereby providing for better image quality.

In addition, another benefit provided by sidewall 35c shape of the glass covering 35 is that photoabsorbent materials (such as used in the design of FIG. 2) are not necessary. Indeed, the digital image sensor package 30 is devoid of photoabsorbent materials positioned between the sidewall 35c and the top of the image sensor substrate 32, and no such photoabsorbent materials (such as those used in the design of FIG. 2) are present between the sidewall 35c and the top of the image sensor substrate 32. By eliminating such photoabsorbent materials, steps for forming such materials and attaching them to the glass covering 35 during manufacture are eliminated.

Figure 4:
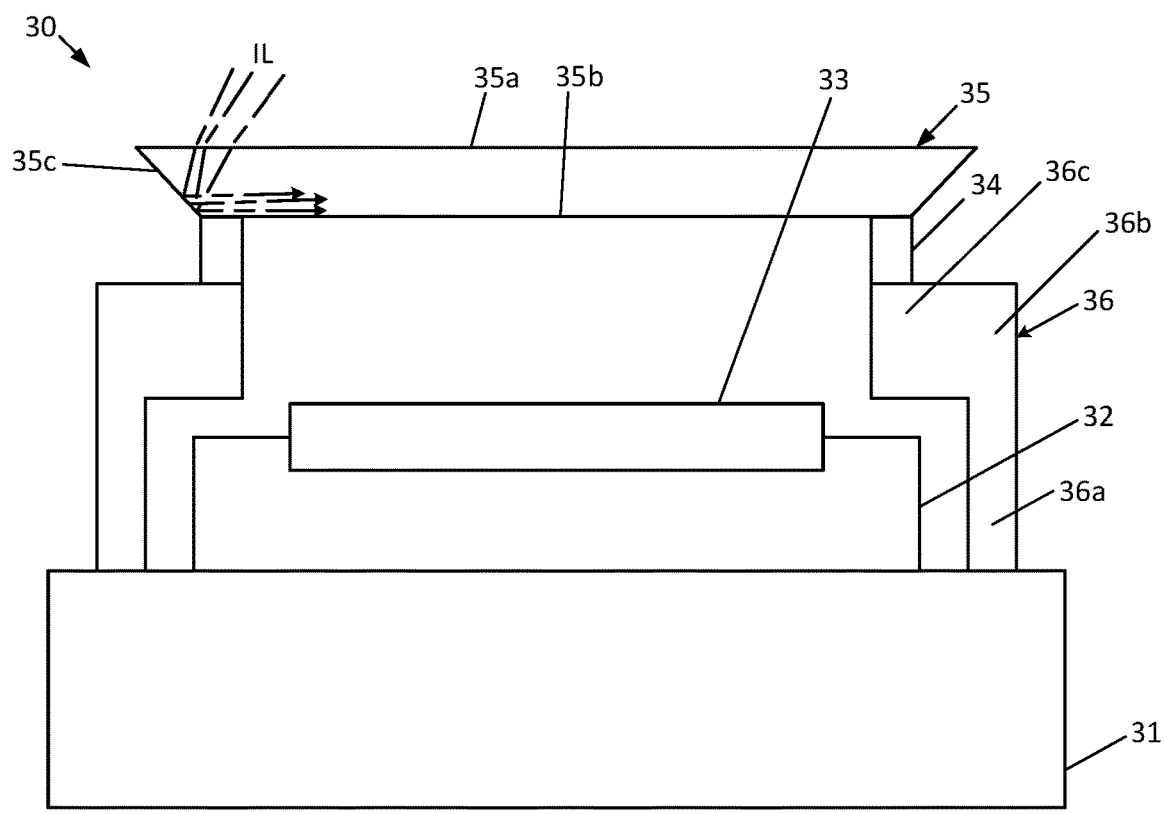
FIG. 4 is a side view of a digital image sensor package in land-grid-array format disclosed herein that addresses the drawbacks of the known digital image sensor package of FIG. 1 by appropriately shaping the glass.

Another digital image sensor package 30' is shown in FIG. 4. This digital image sensor package 30' is in a land-grid-array arrangement. In greater detail, as with the digital image sensor package 30 of FIG. 3, the image sensor substrate 32 is disposed on the printed circuit board 31, and photodiodes 33 are formed in or on the image sensor substrate 32. Here, however, mounting hardware 36 is affixed to the printed circuit board 31, and surrounds at least a portion of the periphery of the image sensor substrate 32 in a spaced apart fashion so as to not contact the image sensor substrate 32. The mounting hardware 36 is comprised of a first portion 36a affixed to the printed circuit board 31 and extending upwardly therefrom, a second portion 36c extending inwardly from the periphery of the image sensor substrate 32 toward the photodiodes 33, and an intermediate connecting portion 36b that connects the first portion 36a to the second portion 36c.

An adhesive layer 34 (which may be transparent) physically couples a glass covering 35 (e.g., a lens) to the top surface of the second portion 36c of the mounting hardware 36, such that the glass covering 35 overlies the image sensor substrate 32. The glass covering 35 has a top surface 35a, a bottom surface 35b, and a sidewall 35c. The periphery of the bottom surface 35b of the glass covering 35 is physically coupled to the second portion 36c of the mounting hardware 36. The top surface 35a of the glass covering 35 is greater in diameter and/or surface area than the bottom surface 35b, such that the sidewall 35c is angled with respect to normal (as defined noted above). As stated earlier, the angle formed by the sidewall 35c and the bottom surface 35b is an obtuse angle (greater than 90°), and/or the angle formed by the sidewall 35c and the top surface 35a is an acute angle (less than 90°), and the purpose of the angles formed by the sidewall 35c with respect to the top surface 35a and bottom surface 35b of the glass covering 35 is to cause incoming light IL that reflects off the sidewall 35c to reflect along a trajectory that avoids the photodiodes 33.

The glass covering 35 of FIGS. 3-4 may be formed to have the above described angles by suitable cutting methodologies, for example using mechanical sawing or chemical etching. The angle formed by sidewall 35c with respect to the top surface 35a may be in the range of 40° to 60° for example, and the angle formed by the sidewall 35c with respect to the bottom surface 35b may be in the range of 120° to 140° for example. Other suitable angles may be used as well. The top surface 35a and bottom surface 35b are illustrated as being straight and not curved, although in some applications, the top surface 35a and bottom surface 35b may be concave or convex as desired. In addition, in some instances, the sidewall 35c may be concave or convex as desired.

Figure 1:
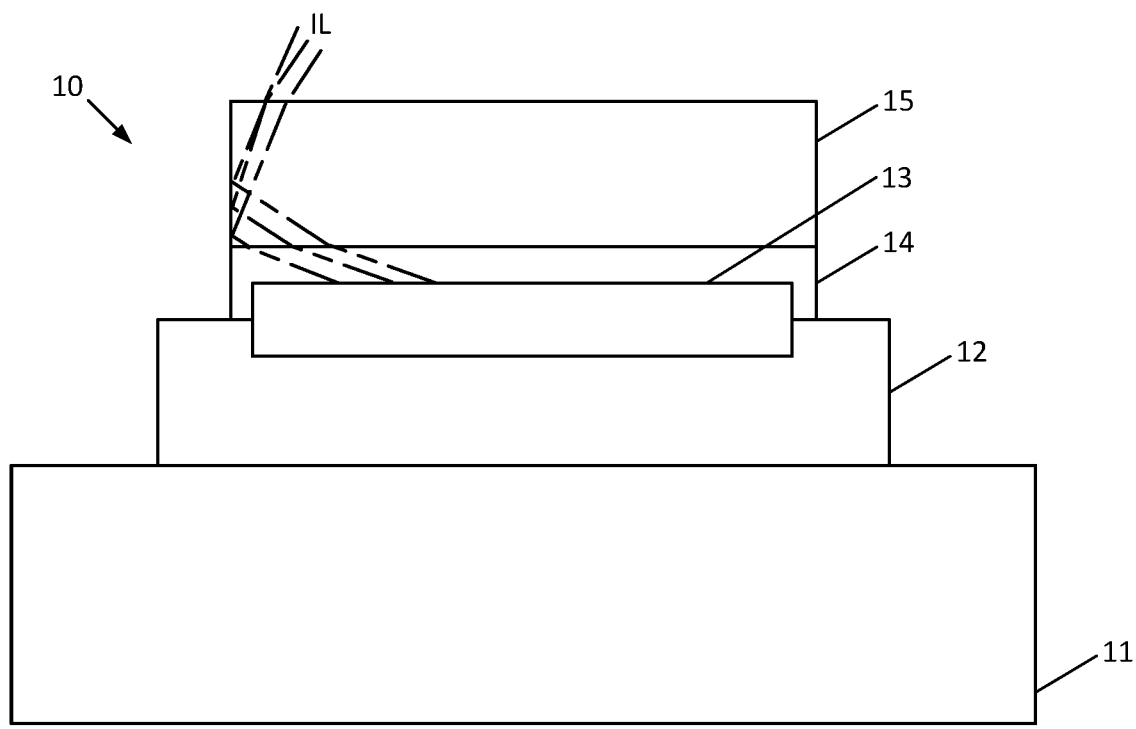
FIG. 1 is a side view of a known digital image sensor package.
Figure 2:
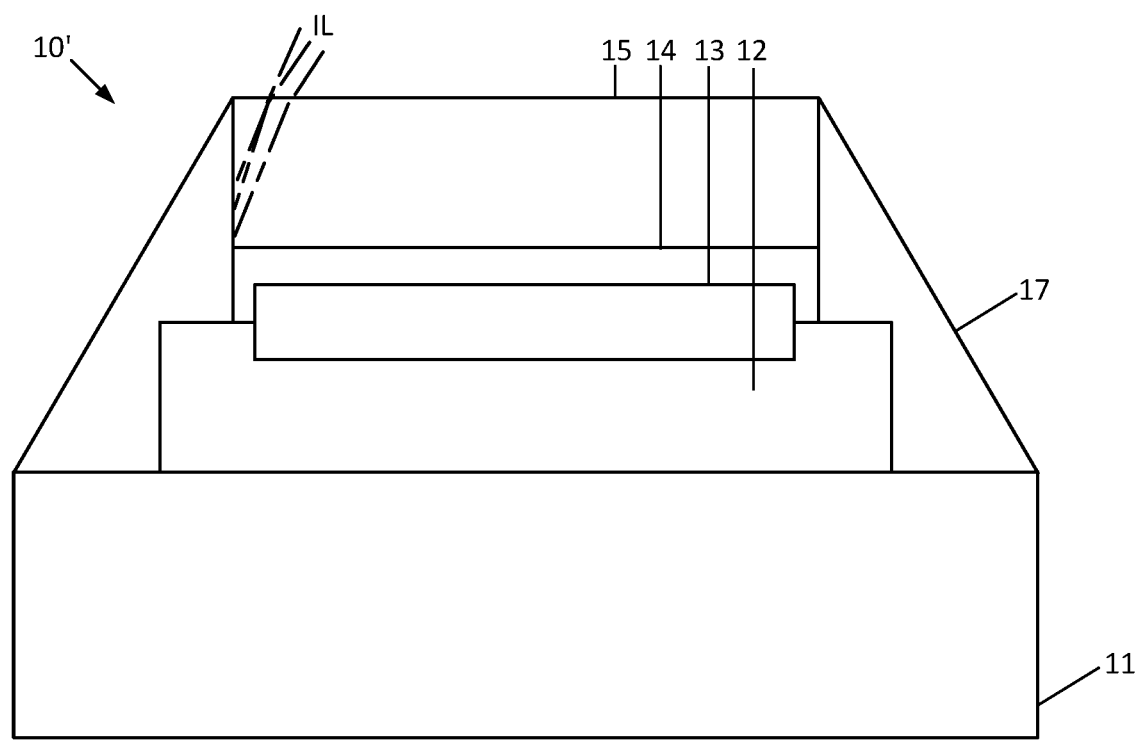
FIG. 2 is a side view of a known digital image sensor package that utilizes photoabsorbent material to mitigate the drawbacks of the known digital image sensor package of FIG. 1.

While some incoming light IL may still reflect off the sidewall 35c in a trajectory that results in it impinging upon the photodiodes 33, such instances are reduced with the designs of FIGS. 3-4 as compared to the designs of FIGS. 1-2.

Note that although the covering 35 is described as being constructed from glass, it may also be constructed from other materials, such as acrylic. In addition, note that in FIGS. 3-4, the covering 35 may be a lens, but may also not be a lens and may simply act as a cover for the image sensor substrate 32.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A digital image sensor package, comprising:
   an image sensor substrate carrying photodiodes; and
   a glass covering having a bottom surface, a top surface opposite the bottom surface, and a sidewall delimiting a perimeter edge of the glass covering, wherein the glass covering is monolithic and overlies all of the photodiodes;
   wherein a surface area of the top surface of the glass covering is greater than a surface area of the bottom surface of the glass covering such that the sidewall is anti-perpendicular to one or both of the top and bottom surfaces of the glass; and
   wherein a surface area of a top surface of the image sensor substrate is greater than the surface area of the bottom surface of the glass covering.

2. The digital image sensor package of claim 1, wherein the sidewall and the top surface of the glass covering form an acute angle, and wherein the sidewall and the bottom surface of the glass covering form an obtuse angle.

3. The digital image sensor package of claim 1, wherein an outer surface of the sidewall is flat.

4. The digital image sensor package of claim 1, wherein a space between the sidewall and image sensor substrate is devoid of photoabsorbent materials.

5. The digital image sensor package of claim 1, wherein at least a portion of the bottom surface of the glass covering is physically coupled to the image sensor substrate.

6. The digital image sensor package of claim 1, further comprising a printed circuit board carrying the image sensor substrate.

7. The digital image sensor package of claim 6, further comprising mounting hardware physically coupling portions of the bottom surface of the glass covering to the printed circuit board.

8. The digital image sensor package of claim 7, wherein the mounting hardware comprises a first portion physically coupled to the printed circuit board and extending upwardly therefrom, a second portion extending inwardly from a periphery of the image sensor substrate toward the photodiodes, and an intermediate connecting portion connecting the first portion to the second portion, wherein portions of the bottom surface of the glass covering are physically coupled to the second portion of the mounting hardware.

9. A digital image sensor package, comprising:
   a printed circuit board;
   an image sensor substrate stacked on the printed circuit board and including photodiodes; and
   a transparent covering associated with the image sensor substrate and having a bottom surface, a top surface opposite the bottom surface, and a sidewall delimiting a perimeter edge of the transparent covering, wherein the transparent covering is monolithic and overlies all of the photodiodes of the image sensor substrate, wherein a surface area of the top surface of the image sensor substrate is greater than a surface area of the bottom surface of the transparent covering;
   wherein the sidewall and the top surface of the transparent covering form a first angle, and the sidewall and the bottom surface of the transparent covering form a second angle different than the first angle; and
   wherein the first and second angles are such that light that enters the transparent covering on a first trajectory that results in the light impinging upon the sidewall being reflected on a second trajectory that avoids the image sensor substrate.

10. The digital image sensor package of claim 9, wherein the first angle is an acute angle and the second angle is an obtuse angle.

11. The digital image sensor package of claim 9, wherein at least a portion of the bottom surface of the transparent covering is physically coupled to the image sensor substrate.

12. The digital image sensor package of claim 9, further comprising mounting hardware physically coupling portions of the bottom surface of the transparent covering to the printed circuit board.

13. The digital image sensor package of claim 12, wherein the mounting hardware comprises a first portion physically coupled to the printed circuit board and extending upwardly therefrom, a second portion extending inwardly from a periphery of the image sensor substrate, and an intermediate connecting portion connecting the first portion to the second portion, wherein portions of the bottom surface of the transparent covering are physically coupled to the second portion of the mounting hardware.

14. The digital image sensor package of claim 9, wherein an outer surface of the sidewall is flat.

15. The digital image sensor package of claim 9, wherein a space between the sidewall and image sensor substrate is devoid of photoabsorbent materials.

16. A digital image sensor package, comprising:
   an image sensor including photodiodes; and a glass covering overlying all of the photodiodes of the image sensor and being trapezoidal in cross section, with a surface area of a top surface of the glass covering being greater than a surface area of a bottom surface of the glass covering, the bottom surface facing the image sensor and the top surface facing away from the image sensor;

wherein the glass covering is monolithic and a surface area of the top surface of the image sensor is greater than the surface area of the bottom surface of the glass covering.

17. The digital image sensor package of claim 16, wherein the top surface of the glass covering being greater in surface area than the bottom surface of the glass covering results in a portion of free space being located between the top surface and the image sensor.

18. The digital image sensor package of claim 16, wherein at least a portion of the bottom surface of the glass covering is physically coupled to the image sensor.

19. The digital image sensor package of claim 16, further comprising:
a printed circuit board carrying the image sensor; and
mounting hardware physically coupling portions of the bottom surface of the glass covering to the printed circuit board;
wherein the mounting hardware comprises a first portion physically coupled to the printed circuit board and extending upwardly therefrom, a second portion extending inwardly from a periphery of the image sensor, and an intermediate connecting portion connecting the first portion to the second portion, wherein portions of the bottom surface of the glass covering are physically coupled to the second portion of the mounting hardware.

20. The digital image sensor package of claim 16, wherein the trapezoidal cross section of the glass covering includes the top surface, the bottom surface, and a sidewall connecting the top surface to the bottom surface; and wherein the trapezoidal cross section of the glass covering results in light that enters the glass covering on a trajectory that results in the light impinging upon the sidewall being reflected away from the image sensor.

21. A digital image sensor package, comprising:
an image sensor substrate carrying photodiodes; and
a glass covering having a bottom surface, a top surface opposite the bottom surface, and a flat sidewall delimiting a perimeter edge of the glass covering, wherein the glass covering is monolithic and overlies all of the photodiodes;
wherein a surface area of the top surface of the glass covering is greater than a surface area of the bottom surface of the glass covering;
wherein a surface area of a top surface of the image sensor substrate is greater than the surface area of the bottom surface of the glass covering;
wherein an acute angle between the flat sidewall and the top surface of the glass is in a range of 40° to 60°; and
wherein an obtuse angle between the flat sidewall and the bottom surface of the glass covering is in a range of 120° to 140°.

22. The digital image sensor package of claim 21, wherein a space between the sidewall and image sensor substrate is devoid of photoabsorbent materials.

23. The digital image sensor package of claim 21, wherein at least a portion of the bottom surface of the glass covering is physically coupled to the image sensor substrate.

24. The digital image sensor package of claim 21, wherein the flat sidewall with the acute angle relative to the top surface and obtuse angle relative to the bottom surface is configured to reflect light that enters the glass through the top surface and impinges on the flat sidewall away from the image sensor.

25. A digital image sensor package, comprising:
an image sensor substrate carrying photodiodes;
a printed circuit board carrying the image sensor substrate;
a glass covering having a bottom surface, a top surface opposite the bottom surface, and a sidewall delimiting a perimeter edge of the glass covering, wherein the glass covering overlies the photodiodes;
wherein a surface area of the top surface of the glass covering is greater than a surface area of the bottom surface of the glass covering such that the sidewall is anti-perpendicular to one or both of the top and bottom surfaces of the glass; and
mounting hardware physically coupling portions of the bottom surface of the glass covering to the printed circuit board, wherein the mounting hardware comprises:
a first portion physically coupled to the printed circuit board and extending upwardly therefrom;
a second portion extending inwardly from a periphery of the image sensor substrate toward the photodiodes so as to define an aperture over the image sensor substrate; and
an intermediate connecting portion connecting the first portion to the second portion;
wherein portions of the bottom surface of the glass covering are physically coupled to a top face of the second portion of the mounting hardware so that the glass covering extends over and across the aperture, the top face of the second portion being opposite to a bottom face of the second portion, the bottom face of the second portion directly facing the image sensor substrate.

26. The digital image sensor package of claim 25, wherein the sidewall and the top surface of the glass covering form an acute angle, and wherein the sidewall and the bottom surface of the glass covering form an obtuse angle.

27. The digital image sensor package of claim 25, wherein an outer surface of the sidewall is flat.

28. The digital image sensor package of claim 25, wherein a space between the sidewall and image sensor substrate is devoid of photoabsorbent materials.

29. A digital image sensor package, comprising:
a printed circuit board;
an image sensor substrate stacked on the printed circuit board and including photodiodes;
a transparent covering associated with the image sensor substrate and having a bottom surface, a top surface opposite the bottom surface, and a sidewall delimiting a perimeter edge of the transparent covering, wherein the transparent covering overlies the image sensor substrate; and
mounting hardware physically coupling portions of the bottom surface of the transparent covering to the printed circuit board, wherein the mounting hardware comprises:
a first portion physically coupled to the printed circuit board and extending upwardly therefrom;

a second portion extending inwardly from a periphery of the image sensor substrate toward the photodiodes so as to define an aperture over the image sensor substrate; and an intermediate connecting portion connecting the first portion to the second portion;

wherein portions of the bottom surface of the glass covering are physically coupled to a top face of the second portion of the mounting hardware so that the glass covering extends over and across the aperture, the top face of the second portion being opposite to a bottom face of the second portion, the bottom face of the second portion directly facing the image sensor substrate;

wherein the sidewall and the top surface of the transparent covering form a first angle, and the sidewall and the bottom surface of the transparent covering form a second angle different than the first angle; and wherein the first and second angles are such that light that enters the transparent covering on a first trajectory that results in the light impinging upon the sidewall being reflected on a second trajectory that avoids the image sensor substrate.

30. The digital image sensor package of claim 29, wherein the first angle is an acute angle and the second angle is an obtuse angle.

31. The digital image sensor package of claim 29, wherein an outer surface of the sidewall is flat.

32. The digital image sensor package of claim 29, wherein a space between the sidewall and image sensor substrate is devoid of photoabsorbent materials.

\* \* \* \* \*